United States Patent
Fazelpour (12)

(10) Patent No.: US 6,274,925 B1
(45) Date of Patent: Aug. 14, 2001

(54) LOW INDUCTANCE TOP METAL LAYER DESIGN

(75) Inventor: Siamak Fazelpour, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/358,579

(22) Filed: Jul. 21, 1999

(51) Int. Cl.[7] .................................................... H01L 23/02
(52) U.S. Cl. .......................... 257/678; 257/684; 257/787; 257/790
(58) Field of Search .................................. 257/678, 684, 257/787, 790; H01L 23/02

(56) References Cited

U.S. PATENT DOCUMENTS

| | | | |
|---|---|---|---|
| 4,577,214 | * | 3/1986 | Schaper ................................. 357/74 |
| 5,214,845 | * | 6/1993 | King et al. ............................. 29/841 |

* cited by examiner

Primary Examiner—Don Wong
Assistant Examiner—Shih-Chao Chen
(74) Attorney, Agent, or Firm—Albert M. Crowder, Jr.; Snell & Wilmer, LLP

(57) ABSTRACT

A substrate based package design for semiconductor chips is disclosed which reduces ground loop inductance. The design includes a substrate having a metal layer providing electrical interconnections. The metal layer includes a first conductive area adapted to provide an electrical ground, and a second conductive area adapted to provide an electrical connection to a power supply voltage. The first conductive area has a plurality of first conductive finger extensions providing electrical connections to vias for the electrical ground, and the second conductive area has a plurality of second conductive finger extensions providing electrical connections to vias for the power supply voltage. The first finger extensions and the second finger extensions are interlaced with each other.

In accordance with another aspect of the invention, an internal conductive ring for ground is provided, with a concentric outer conductive ring for power supply connections. Further, each respective ring has conductive finger extensions in an interlaced comb configuration.

9 Claims, 2 Drawing Sheets

LOW INDUCTANCE TOP METAL LAYER DESIGN

BACKGROUND OF THE INVENTION

1. Technical Field

The present invention relates, generally, to semiconductor manufacturing processes and, more particularly, to the packaging of semiconductor chips using a wire bonded MCM substrate where a top metal layer is designed to minimize inductance and noise contribution.

2. Background Art and Technical Problems

In recent years, noise has become more of a problem in the packaging of semiconductor chips used in high speed digital applications and in radio frequency ("RF") applications. As used herein, radio frequency applications include any applications involving a signal frequency of 500 KHZ or higher. When a semiconductor chip is packaged in a substrate based design, wires are typically bonded to the chip to provide electrical connection to the semiconductor structures formed thereon, including power supply connections and ground connections. The inductance of the ground loop, which includes the current path from the power supply connections through the chip and to the ground connections, has become a limiting factor in many substrate based semiconductor packaging designs. Manifesting itself as a negative contribution to noise performance, the power and ground inductance contributes to simultaneous switching noise ("SSN") in high speed digital applications, and may significantly reduce gain in an RF application.

In an RF application, one hundred picohenrys of ground loop inductance may reduce gain by ½ dB. A 3 dB reduction in gain means that the power is cut in half. Thus, a small amount of inductance can result in significant reductions in gain. In addition, the noise figure is adversely affected by such inductance. This is particularly true in narrow band RF applications, but generally applies to all RF applications.

In high speed digital applications, simultaneous switching noise is equal to $nL^{di}/_{dt}$, where "n" is the number of simultaneous switching buffers, "L" is the inductance, and "$^{di}/_{dt}$" is the rate of switching. As faster and faster rates of switching are achieved, the simultaneous switching noise tends to be dominated by the number of simultaneous switching buffers and the inductance. In the past, the number of simultaneous switching buffers was reduced by increasing the number of power and ground pads. Improved manufacturing processes that allow more and more semiconductor structures to be formed on a given size of chip have resulted in designs that are pad limited in many cases. Thus, increasing the number of power and ground pads is no longer an option in many cases.

In the past, efforts to reduce inductance have involved attempts to add power and ground plane to the substrate. In some cases this seemed to reduce total inductance, but the inductances of the top and bottom layer were unaffected, and the desired reduction in noise was not achieved. Other efforts have included adding more power and ground pins to the chip to compensate for inductance in the substrate. But this increases the size and cost of the chip, and sometimes means that a larger and more costly substrate must be used as well. Additional efforts have included attempts to add more power and ground solder pads to the bottom layer of a substrate. While this may reduce the inductance of the bottom layer, it does not affect the inductance of the top layer.

Past efforts to reduce inductance have included attempts to increase the metal thickness on all layers. This is particularly ineffective at high frequency applications, because at high frequencies current essentially flows on the surface of the metal, and the thickness of the metal is virtually irrelevant. Other efforts have included the use of two rings, one for power and the other for ground for wire bond pads, and putting associated vias in the rings. Since vias of the laminate substrates usually cannot be bonded, this limits the positions on the ring that can be bonded causing bond crosses between adjacent pins that lowers the yield of the assembly.

While parasitic inductance has long been recognized as a problem in substrate based semiconductor packages, efforts in the past to reduce inductance have not been altogether satisfactory. There is a significant need for an improved packaging design that reduces the ground loop inductance of a substrate based semiconductor chip package. An optimized power and ground system is needed to permit chip designers to take advantage of substrate based packaging.

SUMMARY OF THE INVENTION

In accordance with an exemplary embodiment of the present invention, a substrate based package design is provided having a metal layer design to minimize ground loop inductance.

In accordance with a particularly preferred embodiment, a first conductive area is provided with first conductive finger extensions interlaced with second conductive finger extensions coupled to a second conductive area. The first conductive finger extensions provided electrical connections to ground vias, and the second conductive finger extensions provide electrical connections to power supply vias. A substrate based semiconductor package design in accordance with the present invention provides substantially less parasitic inductance than presently known substrate based semiconductor package designs.

In accordance with another aspect of the present invention, an internal conductive ring for ground is provided, with a concentric outer conductive ring for power supply connections, wherein each respective ring has conductive finger extensions in an interlaced comb configuration.

BRIEF DESCRIPTION OF THE DRAWINGS

The present invention will hereinafter be described in conjunction with the appended drawing figures, wherein like numerals denote like elements, and.

DETAILED DESCRIPTION OF PREFERRED EXEMPLARY EMBODIMENTS

Figure 1:
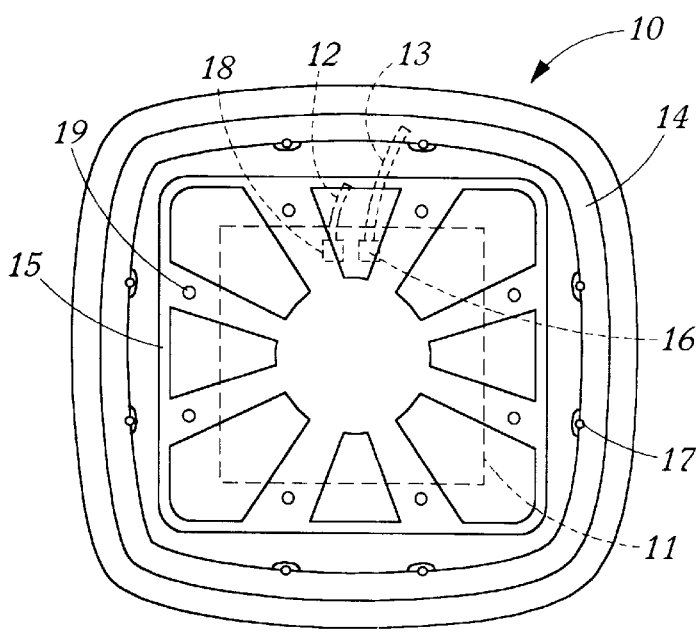
FIG. 1 is a schematic representation of a typical metal layer on a substrate showing how ground and power connections are typically made.

FIG. 1 is a schematic representation of the top metal layer for a substrate 10, with a semiconductor chip 11 shown in dotted lines, as well as two typical wire bonds 12 and 13 shown with dotted lines. FIG. 1 illustrates how ground and power connections have been made in the past, and may be used to describe a typical path followed by ground loop currents. A metal layer 14 for power is provided for connection to a $V_{CC}$ voltage to supply power to the chip 11. One end of the wire 13 is bonded to the bonding pad 16 on the chip 11. The opposite end of the wire 13 is bonded to the metal layer 14. A via 17 is provided in electrical contact with the metal layer 14. The via 17 provides an electrical current path through the substrate 10 to one or more of a plurality of contacts (not shown) on the bottom of the substrate 10. Thus, an external source of $V_{CC}$ voltage would be electrically connected to one or more of such contacts, and the $V_{CC}$ voltage supplied to the chip 11 through a current path through the via 17, the metal layer 14, and the wire 13 bonded to the bonding pad 16 on the chip 11. The term power supply voltage is used herein to refer to what is commonly known in the art as $V_{CC}$, and includes any source of electromotive force or difference in potential from ground that is to be ultimately applied to the chip to power the circuits in the chip.

A ground connection is provided by the wire 12, one end of which is bonded to the chip 11 at a bonding pad 18. The wire 12 has its other end bonded to a metal layer 15 for ground. The metal layer 15 for ground is in electrical contact with a via 19 that provides an electrical current path to one or more of a plurality of contacts (not shown) on the bottom of the substrate 10. Thus, an external ground would be electrically connected to one or more of such contacts, and a return path to ground provided from the wire 12 bonded to the bonding pad 18 on the chip 11, through the metal layer 15, and through the via 19. For purposes of this application, the term "ground" is not limited to an earth ground, but is used in the broader sense known to those skilled in the art, and includes an arbitrary reference point of zero volts considered with reference to $V_{CC}$.

Thus, the length of the current path for ground loop current includes the length of the wire 13 bonded to the bonding pad 16 on the chip 11, the distance current travels through the metal layer 14 until it reaches the via 17, plus the length of the wire 12 bonded to the bonding pad 18 on the chip 11, and the distance current travels through the metal layer 15 until it reaches the via 19. In addition, vertical distances must be considered.

Figure 2:
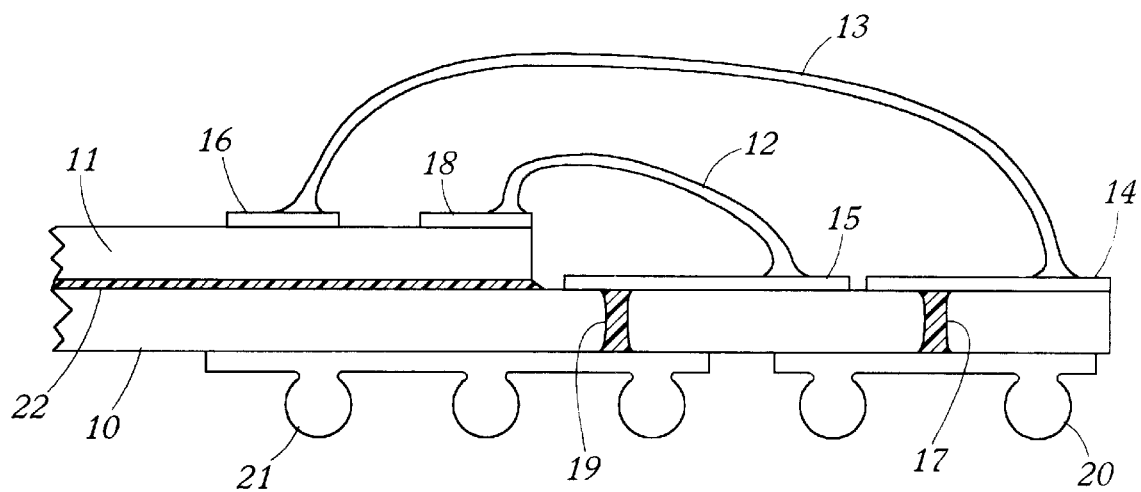
FIG. 2 is a cut-away side view of a schematic diagram of a chip bonded to a substrate showing typical wire bonds to ground and power pads.

This can best be shown with reference to FIG. 2, which is a cut-away side view of a schematic diagram of a chip 11 bonded (with adhesive 22) to a substrate 10. The semiconductor chip 11 may be secured to the substrate 10 by adhesive bonding 22 or by a solder process. The semiconductor chip 11 will have structures defining circuit elements formed therein in a manner known to those skilled in the art, using manufacturing techniques such as ion implantation, etching, oxide layer growth, masking, sputtering, deposition, etc. $V_{CC}$ voltage and ground connections must be provided to the chip 11 to operate the circuit elements formed therein. Typical electrical connections to the chip 11 are provided by a wire 13 bonded to a power bonding pad 16 formed on the chip 11, and a wire 12 bonded to a ground bonding pad 18 formed on the chip 11. A metal layer 14 is formed on the substrate 10 to provide electrical connection to power, and the wire 13 is bonded to that layer 14. Similarly, a metal layer 15 is formed on the substrate 10 to provide electrical connection to ground, and the wire 12 is bonded to that layer 15. The metal layer 14 is formed in electrical contact with the via 17, to provide a current path through the substrate 10 to one or more contacts 20 on the bottom of the substrate 10. Similarly, the metal layer 15 is formed in electrical contact with the via 19, to provide a current path through the substrate 10 to one or more contacts 21 on the bottom of the substrate 10. Thus, the distance that a ground loop current travels includes the vertical distance through the substrate 10 as the current travels through the vias 17 and 19.

It is desirable to reduce or limit the distance between the vias 17 and 19, and to provide locations to bond the wires 13 and 12 as close as possible to the vias 17 and 19, respectively. In accordance with the present invention, a design is provided which minimizes or optimizes these distances to, in turn, reduce the inductance of the ground loop and thereby improve the performance of the packaged semiconductor chip.

Figure 3:
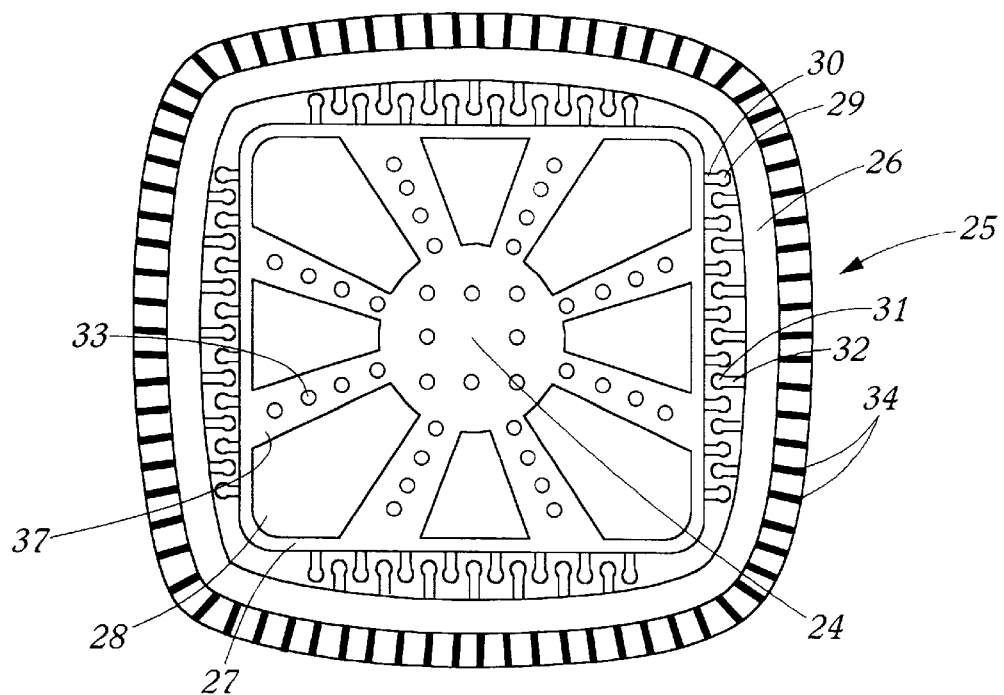
FIG. 3 is an exemplary schematic diagram of a preferred embodiment of the present invention, showing a substrate having a top metal layer with interlaced ground and power supply connections to vias.

FIG. 3 shows a suitable design for the metal layers on a substrate 25 to reduce or minimize ground loop inductance. The substrate 25 includes a metal layer having a first conductive area 27 that provides an electrical ground connection for a chip (not shown) that may be bonded to the substrate 25. It will be understood by those skilled in the art that, similar to the arrangement shown in FIG. 2, the electrical connection to ground between the chip and the first conductive area 27 will be facilitated by wires bonded to the chip and to suitable locations on the first conductive area 27. Referring again to FIG. 3, the substrate 25 includes a metal layer having a second conductive area 26 that provides an electrical connection to a power supply voltage, or $V_{CC}$, for the chip (not shown).

Figure 4:
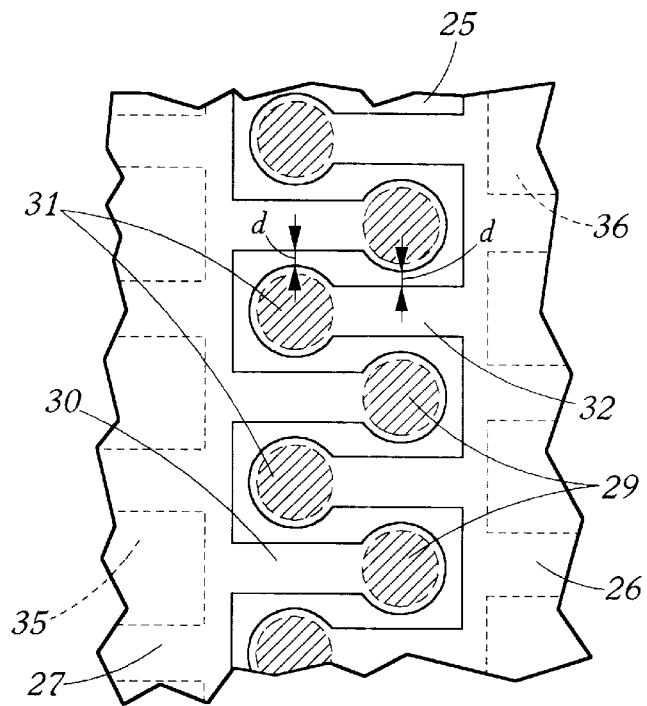
FIG. 4 is a close up view of a portion of the embodiment shown in FIG. 3, and depicts a cut-away schematic diagram of interlaced ground and power supply connections to vias.

Further description of a preferred embodiment may be better understood with reference to FIG. 4, together with FIG. 3. FIG. 4 is a close up of a portion of the embodiment shown in FIG. 3, and depicts a cut-away top view of a schematic diagram of interlaced ground and power supply connections to vias. The first conductive area 27 has a plurality of first conductive finger extensions or traces 30 to provide electrical connection between the first metal conductive area 27 and vias 29 for the electrical ground. The second conductive area 26 has a plurality of second conductive finger extensions or traces 32 to provide electrical connection between the second metal conductive area 26 and vias 31 for the power supply voltage or $V_{CC}$. The first finger extensions 30 are interlaced with the second finger extensions 32, and form an intertwined comb structure.

Those skilled in the art will understand that the manufacturing process for the substrate 25 will have certain design rules relating to minimum spacing, for example, between metal areas that are not intended to be short circuited together. The nature of the manufacturing process is such that for a given process, a minimum spacing must be maintained to accommodate errors in manufacturing steps in order to provide acceptable yields. As shown in FIG. 4, a spacing distance "d" is provided between the via connection 29 and the second finger extension 32. Similarly, the spacing distance "d" is also provided between the via connection 31 and the first finger extension 30. It is desirable to form the first finger extensions 30 and vias 29 in close proximity to the second finger extensions 32 and vias 21. Preferably, the distance "d" between the metal traces 30, 32 and the metal connections to the vias 29, 31 is the minimum distance allowed by the design rules of the substrate manufacturing process.

The semiconductor chip (not shown) is connected to the first conductive area 27 by wires bonded at suitable locations 35. The wire bonding locations 35 are preferably at locations in close proximity to the junction of a first finger extension 30 with the first conductive area 27 in order to reduce the length of the ground loop. Similarly, the chip is connected to the second conductive area 26 by wires bonded at suitable locations 36. The wire bonding locations 36 are preferably at locations in close proximity to the junction of a second finger extension 32 with the second conductive area 26 in order to further reduce the length of the ground loop.

In a preferred embodiment, the substrate 25 includes a plurality of thermal vias 33, which provide a path for conducting heat away from the chip in a manner familiar to those skilled in the art, as shown in FIG. 3. The first conductive area 27 providing a metal layer for ground preferably has openings or cutouts 28 to provide areas for securing or bonding the chip to the substrate 25, for example, with a suitable adhesive. The first conductive area 27 for ground preferably is formed in a star structure with arms 37 extending like spokes 37 from a central area 24. Thermal vias 33 are preferably provided in the arms 37 and the center 24 to reduce the thermal resistance of the substrate 25. Bonding pads 34 are also provided for signal outputs from the chip.

In a preferred embodiment, the second conductive area 26 forms a ring around the first conductive area 27. The first conductive area 27 preferably forms an inner ring with a comb structure of first finger extensions 30 extending outwardly and which are disposed in an interlaced configuration with corresponding second finger extensions 32. The second conductive area 26 preferably forms an outer ring with a comb structure of second finger extensions 32 extending inwardly and which are disposed in an interlaced configuration with corresponding first finger extensions 30.

Each ring 26 and 27 has a width sufficient for wire bonding to fit suitable wire bond pads on them.

A packaged semiconductor may be manufactured by, of course, making a semiconductor chip having structures defining circuit device elements. The substrate based packaged is made by forming a metal layer on a substrate 25 to provide electrical interconnections, where the metal layer so formed includes a first conductive area 27 adapted to provide an electrical ground, and a second conductive area 26 adapted to provide an electrical connection to a power supply voltage. The first conductive area 27 is made by depositing metal using a suitable mask or other technique so that the first conductive finger extensions 30 are simultaneously formed to provide electrical connection to the ground vias 29. Similarly, the second conductive area 26 is made by depositing metal using a suitable mask or other technique so that the second conductive finger extensions 32 are simultaneously formed to provide electrical connections to the power supply vias 31.

The first and second conductive areas 27 and 26, respectively, and the first and second conductive finger extensions 30 and 32, respectively, are preferably formed with metal such as aluminum or copper, or alloys thereof, but may be any suitable conductive material such as other metal alloys, or poly, or impregnated or implanted semiconductor material.

The semiconductor chip is preferably secured to the substrate by adhesive bonding or by a solder process.

Those skilled in the art will appreciate, after having the benefit of this disclosure, that various modifications may be made to the specific embodiment of the invention described herein for purposes of illustration without departing from the spirit and scope of the invention. The description of a preferred embodiment provided herein is intended to provide an illustration of the principles of the invention, and to teach a person skilled in the art how to practice the invention. The invention, however, is not limited to the specific embodiment described herein, but is intended to encompass all variations within the scope of the appended claims.

I claim:

1. A packaged semiconductor device having a substrate based package design for semiconductor chips to reduce ground loop inductance, comprising:

a substrate having a metal layer providing electrical interconnection including a first conductive area adapted to provide an electrical ground and a second conductive area adapted to provide an electrical connection to a power supply voltage, the first conductive area having a plurality of first conductive finger extensions providing electrical connections to vias for the electrical ground, the second conductive area having a plurality of second conductive finger extensions providing electrical connections to vias for the power supply voltage, the first finger extensions and the second finger extensions being interlaced; and a semiconductor chip having structures defining circuit device elements, the semiconductor chip being bonded to the substrate.

2. The packaged semiconductor according to claim 1, wherein the plurality of first conductive finger extensions and the plurality of second conductive finger extensions form an intertwined comb structure.

3. The packaged semiconductor according to claim 2, wherein:

the first conductive finger extensions and the second conductive finger extensions are spaced apart a distance substantially equal to the minimum distance allowed by the design rules of the substrate manufacturing process.

4. The packaged semiconductor according to claim 1, wherein:

the first conductive finger extensions and the second conductive finger extensions are spaced apart a distance substantially equal to the minimum distance allowed by the design rules of the substrate manufacturing process.

5. A packaged semiconductor device, comprising:

a substrate having a metal layer providing electrical interconnections, said metal layer including a first conductive area adapted to provide an electrical ground, the first conductive area having a plurality of first conductive finger extensions providing electrical connections to vias for the electrical ground, the first conductive area forming an inside ring having the first conductive finger extensions extending outwardly, said metal layer including a second conductive area adapted to provide an electrical connection to a power supply voltage, the second conductive area having a plurality of second collective finger extensions providing electrical connections to vias for the power supply voltage, the second conductive area forming a concentric outer ring having the second conductive finger extensions extending inwardly, the first conductive finger extensions and the second conductive finger extensions being interlaced to form an intertwined comb structure, the first conductive finger extensions and the second conductive finger extensions being spaced apart a distance substantially equal to a minimum distance allowed by applicable design rules of a manufacturing process used to make the substrate; and, a semiconductor chip having structures defining circuit device elements, the semiconductor chip being bonded to the substrate, a plurality of wires bonded to the semiconductor chip and the substrate to provide electrical interconnection therebetween, wherein a first such wire has one end of such first wire bonded to a pad on the semiconductor chip, and has another end of such first wire bonded to a pad on the substrate which is electrically connected to the first conductive area, and wherein a second such wire has one end of such second wire bonded to a pad on the semiconductor chip, and has another end of such second wire bonded to a pad on the substrate which is electrically connected to the second conductive area.

6. A packaged semiconductor device having a substrate based package design for semiconductor chips to reduce ground loop inductance, comprising:

a substrate having a metal layer providing electrical interconnections including a first conductive area forming an inside ring having first finger extensions extending outwardly and adapted to provide an electrical ground and a second conductive area forming a concentric outer ring having second finger extensions extending inwardly and adapted to provide an electrical connection to a power supply voltage, the first conductive area having a plurality of first conductive finger extensions providing electrical connections to vias for the electrical ground, the second conductive areas having a plurality of second conductive finger extensions providing electrical connections to vias for the power supply voltage, the first finger extensions and the second finger extensions being interlaced; and a semiconductor chip having structures defining circuit device elements, the semiconductor chip being bonded to the substrate.

7. The packaged semiconductor according to claim 6, wherein:

first conductive finger extensions and second conductive finger extensions form an intertwined comb structure.

8. The packaged semiconductor according to claim 7, wherein:

the first conductive finger extensions and the second conductive finger extensions are spaced apart a distance substantially equal to the minimum distance allowed by the design rules of the substrate manufacturing process.

9. The packaged semiconductor according to claim 6, wherein:

the first conductive finger extensions and the second conductive finger extensions are spaced apart a distance substantially equal to the minimum distance allowed by the design rules of the substrate manufacturing process.

* * * * *